Sept. 1, 1970 T. J. VAN KESSEL 3,526,848

OPERATIONAL AMPLIFIER

Filed May 21, 1968 2 Sheets-Sheet 1

INVENTOR.
THEODORUS J. VAN KESSEL
BY
Frank R. Trifari
AGENT

INVENTOR.
THEODORUS J. VAN KESSEL
BY
Frank R. Trifari
AGENT 3,526,848
Patented Sept. 1, 1970

3,526,848

OPERATIONAL AMPLIFIER

Theodorus Jozef van Kessel, Emmasingel, Eindhoven, Netherlands, assignor, by mesne assignments, to U.S. Philips Corporation, New York, N.Y., a corporation of Delaware Filed May 21, 1968, Ser. No. 730,789
Claims priority, application Netherlands, May 22, 1967, 6707080
Int. Cl. H03f 3/26
U.S. Cl. 330—30 10 Claims

ABSTRACT OF THE DISCLOSURE

An operational amplifier has two cascade connected differential amplifier stages. An output of the second stage developed across an impedance is applied to the two inputs of the second stage, and an output of the first stage constitutes the amplifier output, so that the amplifier output is the sum of the outputs of the two stages. The impedance may comprise a parallel resistance-capacitance circuit.

The invention relates to an operational amplifier including a first difference amplifier having two outputs, at least one of which is also connected to the output of the operational amplifier, while an input signal is applied to said amplifier. In operational amplifiers, a transfer function (i.e. the ratio between the output voltage or -current and the input voltage or -current) should be obtained which has a prescribed course determined by passive switching elements over a very wide frequency range. In operational amplifiers, it is often desirable with regard to the stability that the frequency characteristic should decline (preferably 6 db per octave) in the vicinity of the frequency at which the said transfer function is approximately equal to 1.

If, for example, two amplifier stages are connected in cascade arrangement, this requirement involves problems which are solved, for example, by also applying the input signal directly to the input of the second amplifier stage so that the frequency characteristic of the operational amplifier is equal to the product of the frequency characteristics of the two separate stages plus the frequency characteristic of the second stage. As soon as the first amplifier stage has been de-energized, the output of the operational amplifier only concerns the second amplifier stage and the frequency characteristic of the operational amplifier is equal to the frequency characteristic of the second amplifier stage.

In operational amplifiers, it is often desirable for the frequency characteristic to have a horizontal course from the frequency 0 to a given chosen frequency $f$. With regard to the required D.C.-couplings and the drift phenomena involved, it is desirable for the first amplifier stage to be constructed as a difference amplifier. Thus, an operational amplifier is obtained which has two inputs, that is to say a "+" input (non-inverting input) and a "—" input (inverting input) in accordance with the phase of the input voltage relative to the output voltage of the operational amplifier.

An object of the invention is to provide a particular embodiment of the kind of operational amplifiers set forth which with respect to drift and/or stability is favourably distinguished from the known operational amplifiers, which advantages will be described hereinafter with reference to the figures. Such operational amplifiers are particularly suitable to be integrated in one semiconductor element.

The operational amplifier according to the invention is characterized in that the outputs of the first difference amplifier are connected to the inputs of a second difference amplifier, and in that an output of the second difference amplifier is connected to a terminal of the source of supply through an impedance across which a voltage is produced which is applied through resistors to the two inputs of the second difference amplifier.

The invention will be described with reference to the drawing.

Figure 1:
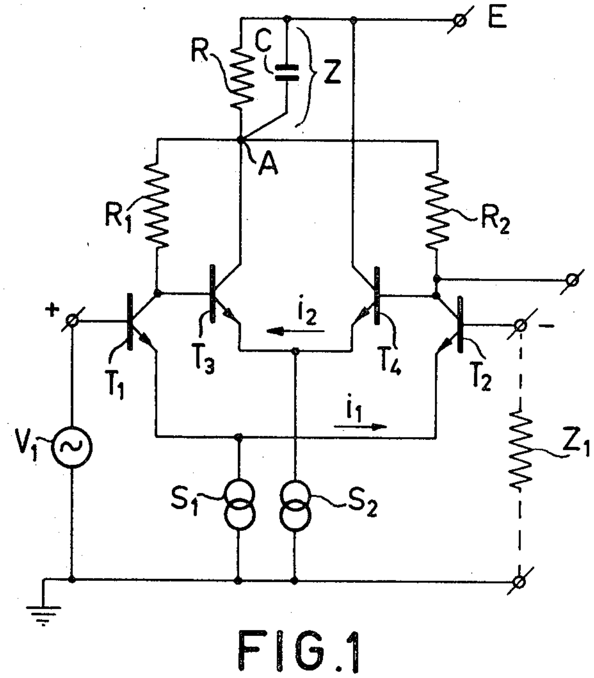
FIG. 1 shows a first embodiment of the operational amplifier according to the invention.

The operational amplifier shown in FIG. 1 comprises a first difference amplifier constituted by transistor $T_1$ and $T_2$ and a second difference amplifier constituted by transistors $T_3$ and $T_4$. The collector of the transistor $T_2$ is connected to the output to the operational amplifier. The basse of the two transistors $T_1$ and $T_2$ are connected to the two inputs of the operational amplifier. The base of the transistor $T_1$ constitutes the "+" input (non-inverting input) and the base of the transistor $T_2$ constitutes the "—" input (inverting input). The collectors of the two transistors $T_1$ and $T_2$ constitute the outputs of the first difference amplifier. The bases of the two transistors $T_3$ and $T_4$ constitute the inputs of the second difference amplifier, while the collectors of these transistors constitute the outputs of the second difference amplifier. The two emitters of the transistors $T_1$ and $T_2$ are connected to ground, through the common current source $S_1$, and the collectors of these transistors are connected through resistors $R_1$ and $R_2$ to the connecting point A of the impedance Z. The other end of this impedance is connected to a point of constant potential.

Assume that the operational amplifier is controlled at the "+" input by the voltage source $V_1$ and that the "—" input is connected to ground through an impedance $Z_1$. The connections of the impedance $Z_1$ to the "—" input and to ground are shown in dotted lines in FIG. 1. If the voltage $V_1$ rises with respect to ground, an alternating current $i_1$ flows through the two transistors $T_1$ and $T_2$ in the direction indicated in FIG. 1. During one phase, this current decreases the voltage across resistor $R_2$ and increases the voltage across the resistor $R_1$. This results in an increase of the base voltage of transistor $T_4$ and in a decrease of the base voltage of transistor $T_3$ so that a current $i_2$ flows through the transistors $T_3$ and $T_4$ in the direction indicated in FIG. 1. This current $i_2$ flows through the impedance Z and decreases the voltage across said impedance. The voltage across the resistor $R_2$ as well as the voltage across the impedance Z decrease if the input voltage $V_1$ increases. This means that the output voltage of the operational amplifier is equal to the sum of the output voltages of the first and of the second difference amplifier.

In the circuit arrangement of FIG. 1, the "+" input and the "—" input vary simultaneously. If this circuit arrangement should be fully utilized, it is desirable for this variation (common mode voltage) to be approximately equal to the limits of control of the output stage without the input stage being bottomed. For this results in that the "+" input and the "—" input change their signs, which involves instability phenomena. Due to the fact that in the circuit arrangement of FIG. 1 the voltage at the coupling point A is a phase with the voltage at the "+" input and the collector of the transistor $T_4$ is directly connected to the voltage supply source E, the maximum permissible voltage at the "+" input is equal to the maximum voltage at the output of the operational amplifier.

As is known, in operational amplifiers of the kind described, it is desirable that the output voltage should not vary substantially due to voltages produced simultaneously at the "+" input and at the "−" input. The amplifier has to be insensitive to in-phase voltages (common mode voltages). A measure for this insensitivity is the rejection factor, i.e. the ratio between the difference amplification and the amplification at which the "+" input and the "−" input are interconnected. In the amplifier of FIG. 1, this rejection factor is also determined by the base-collector current amplification factors of the transistors $T_1$–$T_4$ and by the internal resistances of the two current sources $S_1$ and $S_2$. In the circuit arrangement of FIG. 1, however, the rejection factor is additionally increased because the impedance Z in the collector circuit of the transistor $T_3$ negatively feeds back the in-phase voltage (common mode voltage) amplified by the first difference amplifier ($T_1$, $T_2$), which is illustrated as follows. If it is assumed that the voltages at the "+" input and at the "−" input increase, the collector voltages of the transistors $T_1$ and $T_2$ decrease with respect to earth. As a result, the currents flowing through the transistors $T_3$ and $T_4$ will decrease so that the voltage at the connecting point A of the impedance Z will increase. Thus, the decrease of the collector voltage of the transistor $T_2$ (=output voltage) is compensated for by the increase of the voltage at the connecting point A of the impedance Z.

Figure 4:
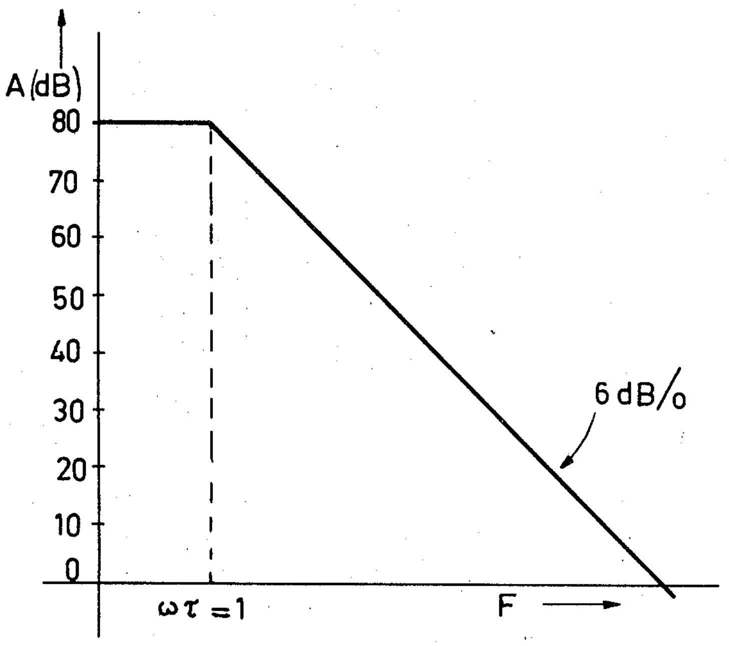

When in the operational amplifier of FIG. 1, the impedance Z in the collector circuit of the transistor $T_3$ is constituted by a parallel combination of a resistor R and a capacitor C, a frequency characteristic can be obtained in a simple manner which has a linear course from the frequency 0 to a given frequency $f$ and then declines by 6 db per octave. By a suitable choice of the time constant $\tau=RC$, the desired course of the frequency characteristic as shown in FIG. 4 can be obtained. In this figure, the frequency $f$ is plotted on the abscissa and the amplification A in db is plotted on the ordinate. The bending point of the frequency characteristic lies at the frequency $f$ at which $2\pi.f.RC=1$.

The location of the frequency-correcting element (capacitor C) as described above affords the advantage that this element, in contradistinction to common practice, is not arranged in the feedback path. Thus, it is achieved that the feedback elements for the operational amplifier, which also determine the desired transmission function, can be chosen quite freely.

Figure 2:
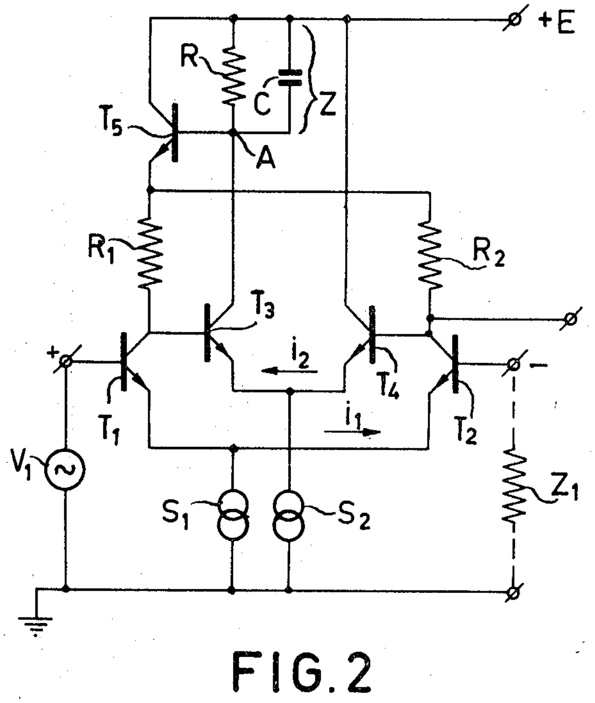
FIG. 2 shows a second embodiment of the operational amplifier according to the invention.

FIG. 2 shows a second embodiment of the operational amplifier according to the invention. In this circuit arrangement, the voltage produced across the impedance Z is applied not directly, but through the base-emitter junction of a transistor $T_5$ connected as an emitter follower to the coupling point A of resistors $R_1$ and $R_2$. The base of transistor $T_5$ is connected to the collector of transistor $T_3$, and the emitter of transistor $T_5$ is connected to the said coupling point A. Due to the presence of transistor $T_5$, the collector currents of the two transistors $T_1$ and $T_2$ are separated from the collector current of the transistor $T_4$ so that the voltage drop across the resistor R and the value of R and hence the amplification can be chosen to be larger.

Figure 3:
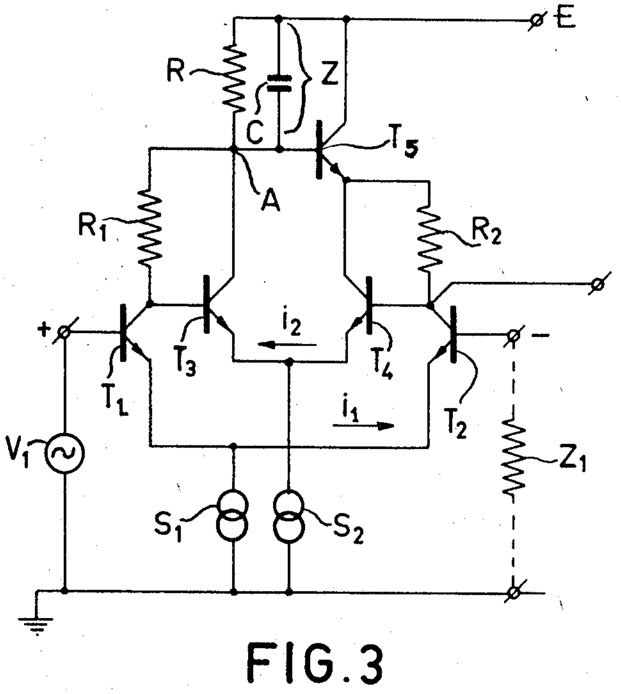
FIG. 3 shows a third embodiment of the operational amplifier according to the invention.

FIG. 3 shows a third embodiment of the operational amplifier according to the invention. In this circuit arrangement, the connecting point A of the impedance Z is directly connected to the base of the transistor $T_5$ and through the resistor $R_1$ to the base of transistor $T_3$. The emitter of the transistor $T_5$ is connected on the one hand to the collector of the transistor $T_4$ and on the other hand through the resistor $R_2$ to the base of transistor $T_4$. The collector of transistor $T_5$ is connected to the positive terminal of the voltage supply source E.

What is claimed is:

1. An operational amplifier including a first difference amplifier having two outputs, at least one of which is also connected to the output of the operational amplifier, whilst an input signal is applied to said amplifier, characterized in that the outputs of the first difference amplifier are connected to the inputs of a second difference amplifier, and in that feedforward means for coupling said amplifiers in both additive and cascade manner in a selected frequency range and for nullifying the output of said second amplifier in another selected frequency range including an output of the second difference amplifier is connected through an impedance to a terminal of the source of supply, across which impedance is produced a voltage which is applied through resistors to the two inputs of the second difference amplifier.

2. An operational amplifier as claimed in claim 1, characterized in that the end of the said impedance connected to the output of the second difference amplifier is connected through two resistors to the two inputs of the second difference amplifier.

3. An operational amplifier as claimed in claim 1, characterized in that the end of the said impedance connected to the output of the second difference amplifier is connected to the base of an auxiliary transistor, the collector of which is connected to the source of supply and the emitter of which is connected through two resistors to the two inputs of the second difference amplifier.

4. An operational amplifier as claimed in claim 1, characterized in that the end of the impedance connected to one output of the second difference amplifier is connected on the one hand through a resistor to an input of the second difference amplifier and on the other hand to the base of the auxiliary transistor, the emitter of which is connected on the one hand through a resistor to the other input of the second difference amplifier and on the other hand to the other output of the second difference amplifier, whilst the collector of the auxiliary transistor is connected to the source of supply.

5. An operational amplifier as claimed in claim 1, characterized in that the other output of the second difference amplifier is connected to a terminal of the source of supply.

6. An operational amplifier as claimed in claim 1, characterized in that it is integrated in one semiconductor element.

7. An operational amplifier comprising an input circuit, an output circuit, a first difference amplifier having first and second inputs connected to said input circuit, first and second outputs, independent means connecting said second output to said output circuit, a second difference amplifier having third and fourth inputs direct coupled to said first and second outputs respectively and a third output, a source of operating potential, feed forward means for coupling said amplifiers in both additive and cascade manner in a selected frequency range and for nullifying the output of said second amplifier in another selected frequency range including impedance means, means connecting one end of said impedance means to said source, first and second resistor means each having one end connected to said third and fourth inputs respectively, and means connecting said third output and the other ends of said first and second resistors to said impedance means.

8. The operational amplifier of claim 7 in which said impedance is a parallel resistance-capacitance circuit.

9. The operational amplifier of claim 8 wherein said first difference amplifier comprises first and second transistors, said second difference amplifier comprises third and fourth transistors, said first, second, third and fourth inputs being connected to the bases of said first, second, third and fourth transistors respectively, said first and second outputs being connected to the collectors of said first and second transistors.

10. The operational amplifier of claim 9 wherein said means applying said voltage at the end of said impedance means to the other end of at least one of said resistors comprises a fifth transistor having its base connected to said end of said impedance means, its emitter connected to said other end of said one resistor, and its collector connected to said source.

References Cited

UNITED STATES PATENTS

| | | | |
|---|---|---|---|
| 2,779,872 | 10/1957 | Patterson ---------- | 330—69 X |
| 3,137,826 | 6/1964 | Boudrias ---------- | 330—30 X |
| 3,153,203 | 10/1964 | Sem-Jacobsen et al. --- | 330—30 |

FOREIGN PATENTS

| | | |
|---|---|---|
| 1,272,752 | 8/1961 | France. |

OTHER REFERENCES

Petrone, "Balanced Differential Amplifier," IBM Technical Disclosure Bulletin, p. 37, vol. 3, No. 8, January 1961 (330-30).

JOHN KOMINSKI, Primary Examiner

L. J. DAHL, Assistant Examiner

U.S. Cl. X.R.

330—28